United States Patent [19]
Kusakabe

[11] Patent Number: 4,876,224
[45] Date of Patent: Oct. 24, 1989

[54] SILICON WAFER FOR A SEMICONDUCTOR SUBSTRATE AND THE METHOD FOR MAKING THE SAME

[75] Inventor: Kenji Kusakabe, Hyogo, Japan

[73] Assignee: Mitsubishi Denki Kabushiki Kaisha, Tokyo, Japan

[21] Appl. No.: 213,495

[22] Filed: Jun. 30, 1988

[30] Foreign Application Priority Data

Jun. 30, 1987 [JP] Japan .................. 62-164354

[51] Int. Cl.⁴ .......................................... H01L 21/324
[52] U.S. Cl. ..................... 437/228; 437/233; 437/12; 148/DIG. 125
[58] Field of Search ........... 148/DIG. 135, DIG. 125, 148/233; 437/12, 13, 228; 156/645

[56] References Cited

U.S. PATENT DOCUMENTS

| | | | |
|---|---|---|---|
| 3,923,567 | 12/1975 | Lawrence | 156/645 |
| 4,053,335 | 10/1977 | Hu | 437/12 |
| 4,608,095 | 8/1986 | Hill | 148/33 |
| 4,608,096 | 8/1986 | Hill | 148/33 |
| 4,622,082 | 11/1986 | Dyson | 437/12 |
| 4,659,400 | 4/1987 | Garbis | 148/175 |
| 4,666,532 | 5/1987 | Koub | 437/13 |

FOREIGN PATENT DOCUMENTS 48009 9/1980 Japan .................. 156/645

OTHER PUBLICATIONS

Ghandi, S. K., *VLSI Fabricatoin Principles*, p. 524, 1983, John Wiley and Sons, 1983.

*Primary Examiner*—Brian E. Hearn
*Assistant Examiner*—Anthony Gutierrez
*Attorney, Agent, or Firm*—Lowe, Price, LeBlanc, Becker & Shur

[57] ABSTRACT

A silicon wafer for a semiconductor substrate comprises a flat wafer body, with a polycrystalline silicon layer formed only on the rear surface of said wafer body.

The silicon wafer is manufactured by the steps of forming a polycrystalline silicon layer on the entire surface of the silicon wafer body, etching and removing the portion of the polycrystalline silicon layer which is formed on the side surface of silicon wafer body, and polishing and removing the polycrystalline silicon layer on the front surface of the silicon wafer body.

7 Claims, 3 Drawing Sheets

SILICON WAFER FOR A SEMICONDUCTOR SUBSTRATE AND THE METHOD FOR MAKING THE SAME

BACKGROUND OF THE INVENTION

1. Field of The Invention

The present invention relates to a silicon wafer for a semiconductor substrate and the method for making the same and, more particularly, it relates to a silicon wafer for a semiconductor substrate having polycrystalline silicon deposited on the surface thereof and the method for making the same.

2. Description of The Prior Art

As shown in FIG. 1, in a conventional silicon wafer for a semiconductor substrate, only the front surface of a wafer body 1 is exposed and other surfaces are covered with a deposited polycrystalline silicon layer 2. Namely, in the conventional silicon wafer for a semiconductor substrate, the polycrystalline silicon layer 2 is provided on the side surfaces of the wafer body 1 besides the polycrystalline silicon layer 2 deposited on the back surface of the silicon wafer body 1, which is required for its function.

The above described conventional silicon wafer for a semiconductor substrate is manufactured by the following steps, namely, the polycrystalline silicon layer 2 is deposited on the entire surface of the wafer body 1 by chemical vapor deposition method and, thereafter, the mirror-like finishing is effected by the mechanochemical polish on the front surface of the wafer.

Meanwhile, U.S. Pat. No. 4,608,095 discloses reinforcing the getter effect by depositing a polycrystalline silicon of 0.05 to 2.0 μm in thickness on the back surface of the semiconductor substrate. U.S. Pat. No. 4,053,335 discloses depositing polycrystalline silicon on the rear surface of the semiconductor substrate and sealing heavy metal movable ions in the polycrystalline silicon during high temperature processing.

In the above described conventional silicon wafer for a semiconductor substrate, the polycrystalline silicon 2 deposited on the periphery of the wafer body 1 is liable to peel off due to the abrupt change of the shape of the silicon wafer periphery during the manufacturing process of the semiconductor device. Therefore, in the silicon wafer for a semiconductor substrate obtained in accordance with the conventional manufacturing method, the polycrystalline silicon layer 2 on the periphery of the wafer body 1 is a cause of dust.

SUMMARY OF THE INVENTION

The present invention was made to solve the above described problems and its object is to provide a silicon wafer for a semiconductor substrate capable of preventing dust made by the polycrystalline silicon layer.

The silicon wafer for a semiconductor substrate in accordance with the present invention is provided with a polycrystalline silicon layer on the surface of a flat wafer body, characterized in that the polycrystalline silicon layer is provided only on the rear surface of the wafer body.

The method for manufacturing the silicon wafer for a semiconductor substrate in accordance with the present invention basically comprises the steps of forming a polycrystalline silicon layer on the entire surface of the silicon wafer body, and removing the polycrystalline silicon layer on the front surface of the silicon wafer body by polishing. In addition, the manufacturing method in accordance with the present invention further comprises the step of etching a portion of the polycrystalline silicon layer formed on the side surfaces of the silicon wafer body.

Preferably, the formation of the polycrystalline silicon layer is effected by, for example, chemical vapor deposition method. The said removal by the polishing may be accompanied with a mirror-like finishing. As for the said etching, the dipping in the mixed acid of hydrogen fluoride, nitric acid and acetic acid is employed. The said etching is carried out by, for example, stacking a plurality of silicon wafers in the direction of its thickness and by dipping the stack in the mixed acid.

The silicon wafer for a semiconductor substrate in accordance with the present invention obtained from the above described manufacturing method has the polycrystalline silicon layer only on the rear surface of the wafer body. Therefore, even if the shape of the peripheral part of the silicon wafer changes abruptly during the manufacturing process of the semiconductor device, there will be no dust made by the peeled polycrystalline silicon layer on the periphery of the silicon wafer.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
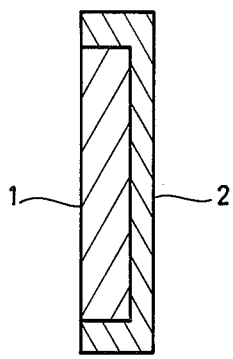
FIG. 1 is a vertical sectional view of a conventional silicon wafer.
Figure 2:
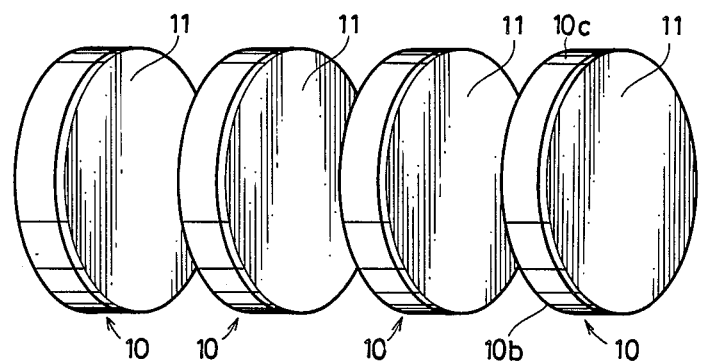
FIG. 2 is a side view of the silicon wafer for a semiconductor substrate in accordance with the present invention.

FIG. 2 shows four silicon wafers for the semiconductor substrate in accordance with the present invention. Referring to FIG. 2, a polycrystalline silicon layer 11 is provided on the rear surface 10a of a flat wafer body 10. the polycrystalline silicon layer 11 is not provided on either the front surface 10b or the side surface 10c of the wafer body 10, so that the surface of the wafer body 10 is exposed.

Therefore, when this silicon wafer is employed, the conventional disadvantage is not caused that the polycrystalline silicon layer in the periphery is liable to peel off due to the abrupt change of the shape of the silicon wafer periphery during the manufacturing process of the semiconductor device. Therefore, the problem of dust made of the polycrystalline silicon in the silicon wafer periphery can be eliminated.

The method for manufacturing the silicon wafer for a semiconductor substrate shown in FIG. 2 will be hereinafter described.

Figure 3:
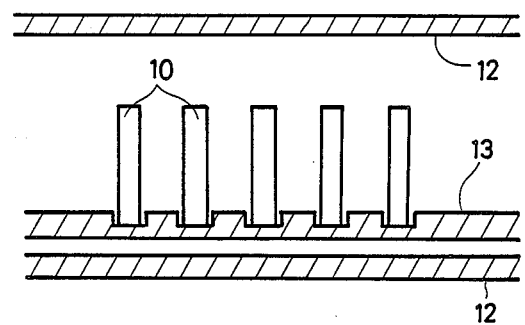
FIG. 3 is a schematic vertical sectional view of a device for practicing the chemical vapor deposition method.
Figure 4:
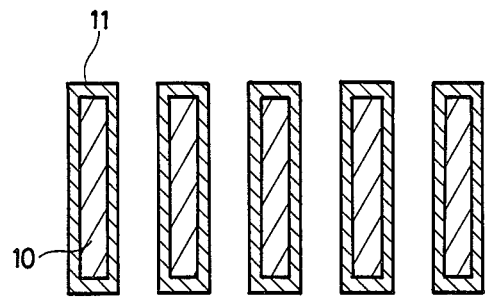
FIG. 4 is a vertical sectional view showing the state of the silicon wafer during the manufacturing process.

First, a single crystal flat wafer body 10 is set in a chemical vapor deposition device shown in FIG. 3. In FIG. 3, the wafer bodies 10 are placed spaced apart from each other on a quartz boat 13 arranged in a quartz tube 12. A mixed gas of $SiH_4$ serving as a source gas and $N_2$ serving as a carrier gas is introduced in the quartz tube 12 of FIG. 3 and, a polycrystalline silicon is deposited on the surface of the wafer body 10 by the chemical vapor deposition method. Thus, a silicon wafer having the entire surface covered with the polycrystalline silicon layer 11, as shown in FIG. 4 is manufactured.

Figure 5:
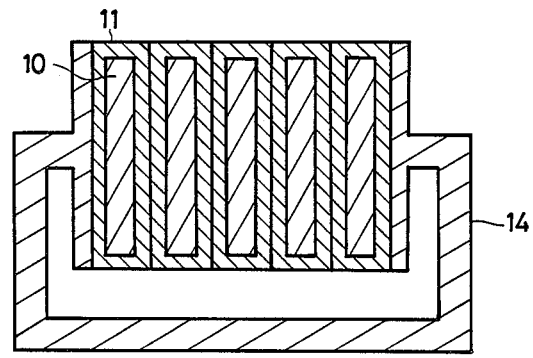
FIG. 5 is a vertical sectional view of a holder employed in the etching process.
Figure 6:
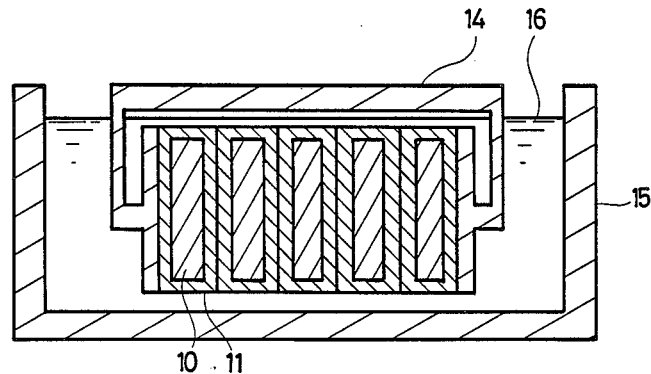
FIG. 6 is a vertical sectional view showing the process of etching.
Figure 7:
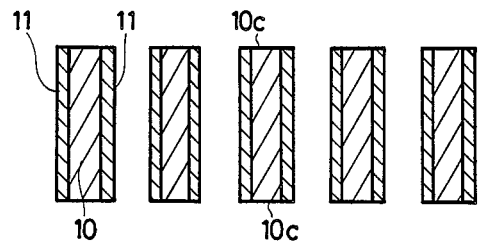
FIG. 7 is a vertical sectional view of the silicon wafer after the completion of the etching process.

The obtained plurality of silicon wafers are stacked in the direction of its thickness as shown in FIG. 5, and held by a holder of polytetrafluoroethylene (hereinafter referred to as PTFE) having the holding area as wide as or wider than the main surface of the silicon wafer. The silicon wafers fixed in the holder 14 are dipped in the mixed acid 16 reserved in an etching tub shown in FIG. 6. The mixed acid 16 comprises, for example a mixture of hydrogen fluoride, nitric acid and acetic acid. The etching tub 15 is formed of PTFE. Since only the side surface of the silicon wafer dipped in the mixed acid 16 are in contact with the mixed acid, the polycrystalline silicon layers 11 only on the side surfaces of the silicon wafer are etched, thus the side surfaces 10c of the wafer body 10 are exposed as shown in FIG. 7. Consequently, a silicon wafer can be obtained in which the polycrystalline silicon layer 11 only in the periphery is removed.

Figure 8:
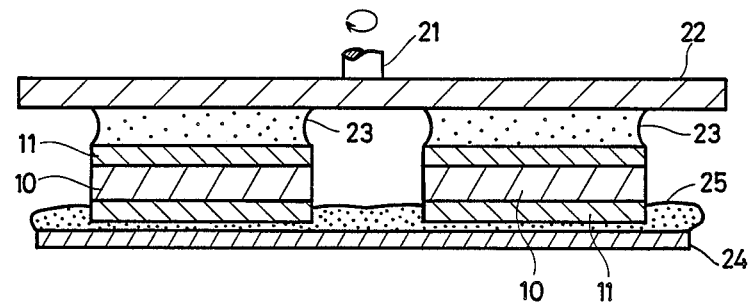
FIG. 8 is a vertical sectional view of the polishing device.

Next, the mechanochemical polish process is effected on the obtained silicon wafer. FIG. 8 shows the polishing device, in which a disk form ceramic plate 22 is integrally provided on the lower end of the central rotary axis 21. The silicon wafer with the polycrystalline silicon layer 11 in the periphery removed is fixed on the lower surface of the ceramic plate 22 by means of wax 23. In this case, it is fixed such that the ceramic plate 22 side of the silicon wafer corresponds to the rear surface. Thereafter, the ceramic plate 22 with the silicon wafer fixed thereon is placed on a polishing cloth 24 and the ceramic plate 22 is rotated with an abrasive powder 25 flown between the silicon wafer and the polishing cloth 24. In this manner, the front surface of the silicon wafer is mirror polished. Thus, a silicon wafer for a semiconductor substrate is provided in which the polycrystalline silicon layer 11 is provided only on the rear surface 10a of the wafer body 10 and not on either the front surface 10b or the side surface 10c.

Figure 9:
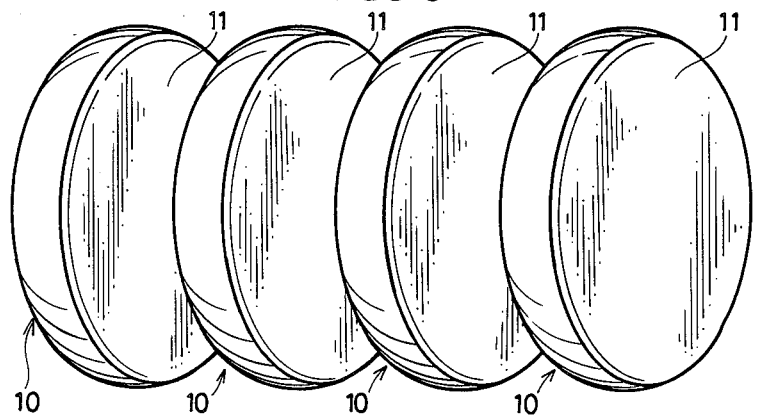
FIG. 9 is a side view of the silicon wafer according to another embodiment.

Although the above embodiment description was made of a silicon wafer without chamfering, the present invention can be similarly applied to a chamfered silicon wafer such as shown in FIG. 9.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a silicon wafer for a semiconductor substrate comprising the steps of
   forming a polycrystalline silicon layer on the entire surface of a silicon wafer body of a silicon wafer,
   etching and removing that portion of the polycrystalline silicon layer which is formed on the side surface of the silicon wafer body, and
   polishing and removing the polycrystalline silicon layer on the front surface of the silicon wafer body.

2. A method for manufacturing a silicon wafer for a semiconductor substrate according to claim 1, wherein the step of forming said polycrystalline silicon layer is carried out by chemical vapor deposition method.

3. A method for manufacturing a silicon wafer for a semiconductor substrate according to claim 1, wherein said etching step is carried out by stacking a plurality of silicon wafers in the direction of the thickness and by dipping the stack in mixed acid.

4. A method for manufacturing a silicon wafer for a semiconductor substrate according to claim 3, wherein said etching step further comprises the step of holding the stacked silicon wafers in a holder of polytetrafluoroethylene having the holding are as wide as or wider than the main surface of the silicon wafer.

5. A method for manufacturing a silicon wafer for a semiconductor substrate according to claim 4, wherein said mixed acid comprises hydrogen fluoride, nitric acid and acetic acid.

6. A method for manufacturing a silicon wafer for a semiconductor substrate according to claim 1, wherein said polishing step comprises mirror-like finishing.

7. A method for manufacturing a silicon wafer for a semiconductor substrate according to claim 6, wherein said polishing step further comprises the steps of
   fixing said silicon wafer on the lower surface of a ceramic plate by means of wax, and
   placing said ceramic plate on a polishing cloth and rotating the ceramic plate with an abrasive powder flown between the silicon wafer and the polishing cloth.

* * * * *